United States Patent
Sakai

[11] Patent Number: 5,966,052
[45] Date of Patent: Oct. 12, 1999

[54] VOLTAGE-CONTROLLED OSCILLATOR WITH INPUT AND OUTPUT ON OPPOSITE CORNERS OF SUBSTRATE

[75] Inventor: Ken Sakai, Komatsu, Japan

[73] Assignee: Murata Manufacturing Co., Ltd., Nagaokakyo, Japan

[21] Appl. No.: 09/057,488

[22] Filed: Apr. 9, 1998

[30] Foreign Application Priority Data

Apr. 9, 1997 [JP] Japan ................................. 9-090804

[51] Int. Cl.[6] .............................. H03B 1/04; H03B 5/00; H05K 5/04; H05K 7/08
[52] U.S. Cl. .................. 331/68; 331/108 D; 331/187; 331/175; 361/752; 361/760; 29/852
[58] Field of Search ........................... 331/36 C, 68, 331/74, 108 D, 175, 177 V, 187; 361/730, 743, 748, 752, 760, 772, 774, 784, 799, 800; 29/852

[56] References Cited

U.S. PATENT DOCUMENTS

| | | | |
|---|---|---|---|
| 4,572,757 | 2/1986 | Spadafora | 156/252 |
| 5,644,107 | 7/1997 | Kubota et al. | 174/262 |
| 5,729,437 | 3/1998 | Hashimoto | 361/760 |

FOREIGN PATENT DOCUMENTS

| | | |
|---|---|---|
| 149-923-A2 | 7/1985 | European Pat. Off. . |
| 582-881-A1 | 2/1994 | European Pat. Off. . |
| 689-245-A2 | 12/1995 | European Pat. Off. . |

OTHER PUBLICATIONS

Japanese Abstracts of Japan, vol. 9, No. 61, Mar. 19, 1985, Abstract No. 59–198739.
Japanese Abstracts of Japan, vol. 8, No. 149, Jul. 12, 1984, Abstract No. 59–054247.

*Primary Examiner*—David Mis
*Attorney, Agent, or Firm*—Burns, Doane, Swecker & Mathis, LLP

[57] ABSTRACT

Four generally quadrant-like indentations are formed at the corners of a substrate. A conductive member is applied to the inner surfaces of the indentations to form input and output terminals, namely a power voltage terminal, a voltage control terminal, a modulation terminal, and an output terminal. By placing these terminals at the corners of the substrate, sufficient distances are provided between the input terminals and the output terminals so as to prevent interference between these terminals.

20 Claims, 3 Drawing Sheets

VOLTAGE-CONTROLLED OSCILLATOR WITH INPUT AND OUTPUT ON OPPOSITE CORNERS OF SUBSTRATE

This application is based on Japanese Patent Application No. 9-90804 filed on Apr. 9, 1997, which is incorporated in its entirety herein by reference.

BACKGROUND OF THE INVENTION

1. Field of the Invention

The present invention relates to a voltage-controlled oscillator constituting a local oscillator used in a mobile communication unit, such as a portable telephone. The present invention also relates to a method for making such a voltage-controlled oscillator.

2. Description of the Related Art

The configuration of a conventional voltage-controlled oscillator will be described below by referring to FIG. 5.

In FIG. 5, there is shown a substrate 21 for a voltage-controlled oscillator. A plurality of ceramic sheets are laminated to form the substrate 21. On one main surface 21a of the substrate 21, circuit devices such as a varicap diode Vd serving as a variable-capacitance device, a capacitor C1, and a transistor Tr are provided. At side faces 21c and 21d of the substrate 21, generally semicircular indentations 24a, 24b, 24c, and 24d, and generally elongated-circular indentations 25a and 25b having a larger opening than the indentations 24a to 24d are formed. At side faces 21e and 21f, generally elongated-circular indentations 25c and 25d are formed in the same way as for the indentations 25a and 25b. A conductive member is applied to the inner surfaces of these indentations to form input terminals, a power voltage terminal Vb, a voltage control terminal Vc, a modulation terminal M1, an output terminal P1, and ground terminals Ga, Gb, Gc, and Gd. The circuit devices, the input terminals, the output terminal, and the ground terminals are connected to each other through wiring sections (not shown) formed on one main surface 21a of and inside the substrate 21. A control voltage applied to the voltage control terminal Vc, which is an input terminal, is changed to alter the capacitance of the varicap diode Vd, thereby changing the oscillating frequency. A control voltage applied to the modulation terminal M1, which is also an input terminal, is changed to start and stop oscillation.

A manufacturing method for the conventional voltage-controlled oscillator will be described next.

A motherboard 31 shown in FIG. 6 is prepared first. More specifically, in constructing the motherboard, a conductive member is printed on or applied to a plurality of ceramic sheets (not shown). Then, circuit devices and wiring sections are provided. These sheets are then laminated to form the motherboard 31. The motherboard 31 is cut along boundaries 33a and 33b to produce a number of the individual substrates 21 shown in FIG. 5.

More specifically, in the motherboard 31, through holes 34 having generally elongated-circular openings are provided on the boundaries 33a, and through holes 35 having generally circular openings and through holes 34 are provided on the boundaries 33b. A conductive member (not shown) is applied to the inner surfaces of the through holes 34 and 35. The motherboard 31 is cut along the boundaries 33a and 33b to produce a plurality of the substrates 21. In this case, the through holes 34 and 35 are divided and the conductive member applied to the inner surfaces of the through holes 34 and 35 are exposed to form the input terminals Vb, Vc, and M1, the output terminal P1, and the ground terminals Ga to Gd of the substrate 21. Each substrate 21 obtained in this way is put in a metal case (not shown) for shielding to form a voltage-controlled oscillator.

In the conventional voltage-controlled oscillator, however, since each terminal is provided on a side face of the substrate 21, the distance between the output terminal P1 and the power voltage terminal Vb and the voltage control terminal Vc becomes short. Therefore, radiation may occur between these terminals due to high-frequency interference, and, as a result, phase-noise (C/N) characteristics may deteriorate.

In the conventional manufacturing method for a voltage-controlled oscillator, since the through holes 35 formed on the motherboard 31 are shared by two divisions (substrates 21) specified by the boundaries 33b, which are used as input and output terminals, it is necessary to form a relatively large number of the holes in the entire motherboard 31. In addition, since the diameter of the holes is small, making the holes is complicated, which makes cost reduction difficult.

SUMMARY OF THE INVENTION

Accordingly, it is an object of the present invention to provide a voltage-controlled oscillator in which C/N characteristics are prevented from deteriorating by ensuring sufficient distances between input and output terminals to prevent interference between these terminals. Another object is to provide a manufacturing method for the voltage-controlled oscillator which can reduce the number of through holes formed in the motherboard.

One of the foregoing objects is achieved through the provision of a voltage-controlled oscillator including: a substrate having a plurality of indentations on a side face; a circuit device and a wiring section provided on a first main surface of the substrate; a ground electrode formed on the other main surface of the substrate; terminals formed by applying a conductive member to the plurality of indentations; and a metal case provided on the first main surface of the substrate to cover the first main surface, wherein part of the plurality of indentations are disposed at corners of the substrate; and terminals formed at the indentations disposed at corners of the substrate serve as input terminals or output terminals.

Other of the foregoing objects are achieved through the provision of a manufacturing method for a voltage-controlled oscillator including the steps of: providing, on a surface of a motherboard to be divided into a plurality of substrates by cutting, a circuit device and a wiring section for each substrate; making through holes on boundaries which partition the motherboard into the substrates and at the intersections of the boundaries, and applying a conductive member to the through holes; cutting the motherboard along the boundaries to form an indentation and a terminal at each corner and at each side face of the plurality of the substrates; and mounting a metal case for covering a main surface on one main surface of each respective substrate.

In a voltage-controlled oscillator according to the present invention, since input terminals and an output terminal are provided at the corners of the substrate, the output terminal and a power voltage terminal, which is an input terminal, are disposed with a distance generally equal to the length of the short side of the substrate. The output terminal and a control voltage terminal, which is an input terminal, are disposed with a distance generally equal to the length of the diagonal of the substrate. Since the input and output terminals are disposed in this way with certain distances between them, high-frequency interference between these terminals is prevented. Thereby, the phase-noise (C/N) characteristic of the voltage-controlled oscillator is prevented from deteriorating.

In a manufacturing method for a voltage-controlled oscillator according to the present invention, the through holes for producing input terminals and an output terminal are formed at the intersections of boundaries of substrates on a motherboard. These through holes serving as input and output terminals are thus also shared by adjacent substrates partitioned on the motherboard. Accordingly, the number of the through holes can be made relatively small for the entire motherboard, which facilitates the job of forming the through holes. Further, since the total amount of conductive member applied to the inner surfaces of the through holes in order to form the input terminals and the output terminal is relatively small, cost is reduced.

BRIEF DESCRIPTION OF THE DRAWINGS

These and other objects, features and advantages of the invention will be apparent from the following more particular description of preferred embodiments of the invention, as illustrated in the accompanying drawings, wherein.

DESCRIPTION OF THE PREFERRED EMBODIMENT

Figure 1:
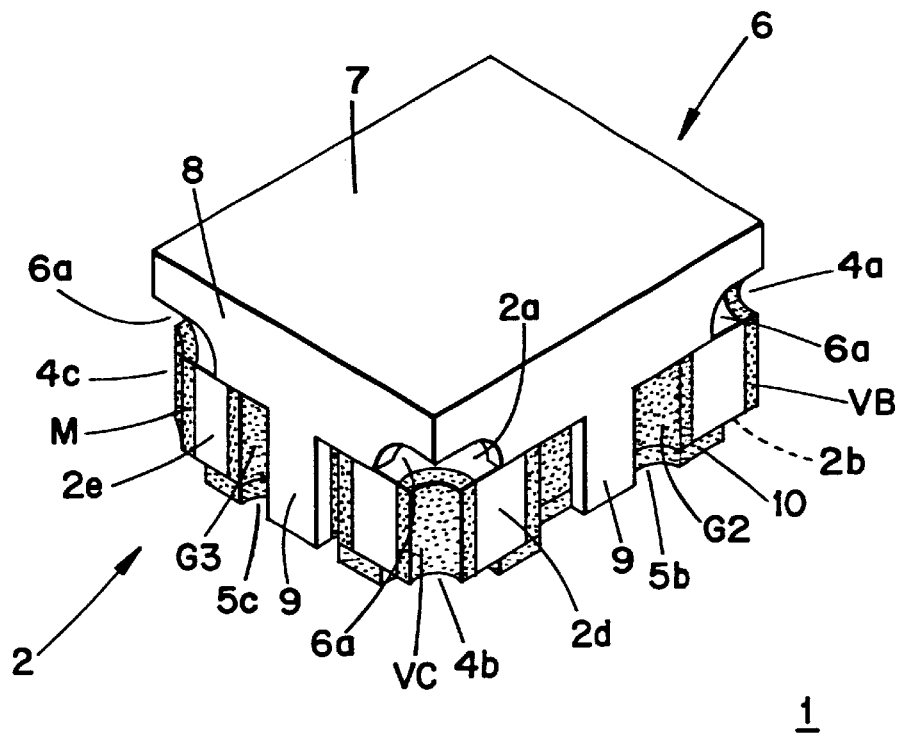
FIG. 1 is a perspective view of a voltage-controlled oscillator according to a first exemplary embodiment of the present invention.

The configuration of a voltage-controlled oscillator according to an embodiment of the present invention will be described below by referring to the drawings.

In FIG. 1, there is shown an exemplary voltage-controlled oscillator 1 which is formed by mounting a metal case 6 for blocking external noise on a substrate 2. The substrate 2 is formed of a plurality of ceramic sheets (not shown) which are laminated and provided with circuit devices and input and output terminals described later.

Figure 2:
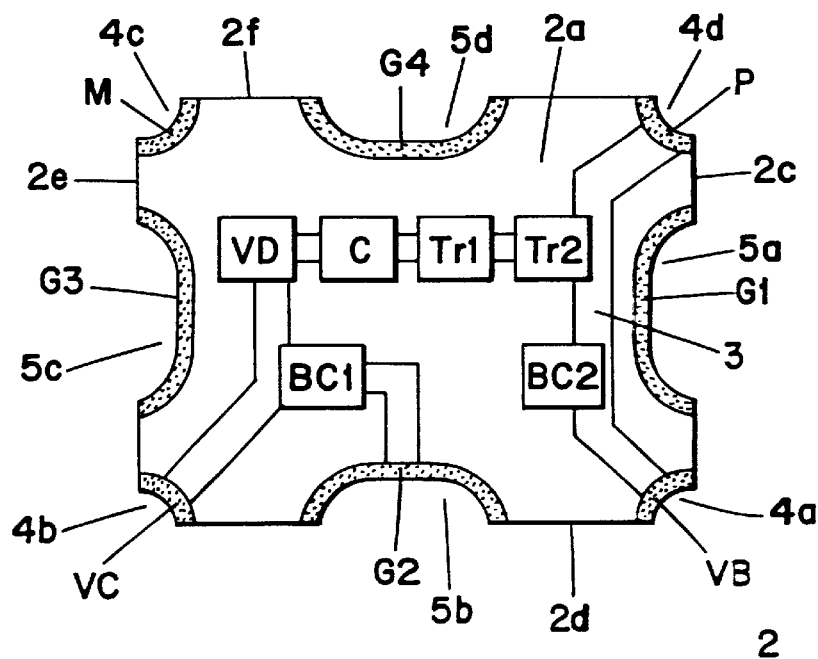
FIG. 2 is a top view of the substrate of the voltage-controlled oscillator shown in FIG. 1.

As shown in FIG. 2, on one main surface 2a of the substrate 2, a varicap diode VD serving as a variable-capacitance device, transistors Tr1 and Tr2, a capacitor C, bypass capacitors BC1 and BC2, and other various circuit devices (not shown) can be provided. These circuit devices are connected to each other by a wiring section 3 shown in a simplified manner on one main surface 2a of the substrate 2. Among the two transistors, Tr1 forms an oscillating stage and Tr2 forms a buffer stage for increasing a voltage and for maintaining the frequency by providing isolation from the outside. The capacitor C is used for applying feed-forward to the transistor Tr1. At the corners of the substrate 2, generally quadrant-like indentations 4a, 4b, 4c, and 4d are formed (e.g., these indentations are quadrant-like in the sense that they form generally a quarter of a circle or other geometrical shape). A conductive member is applied to the inner surfaces of the indentations to form an output terminal P and input terminals, namely a power voltage terminal VB, a voltage control terminal VC, and a modulation terminal M. At generally the centers of the side faces 2c, 2d, 2e, and 2f of the substrate 2, generally elongated circular (e.g., elliptical) indentations 5a, 5b, 5c, and 5d having a larger opening than the indentations 4a to 4d are formed. A conductive member is applied to the inner surfaces of the indentations to form ground terminals G1, G2, G3, and G4. These circuit devices, the input and output terminals, and the ground terminals are connected to the wiring section 3 on one main surface 2a of the substrate 2 and to a wiring section (not shown) provided inside the substrate 2. A control voltage applied to the voltage control terminal VC is changed to alter the capacitance of the varicap diode VD, thereby changing the oscillating frequency. A control voltage applied to the modulation terminal M is changed to start and stop oscillation.

Figure 3:
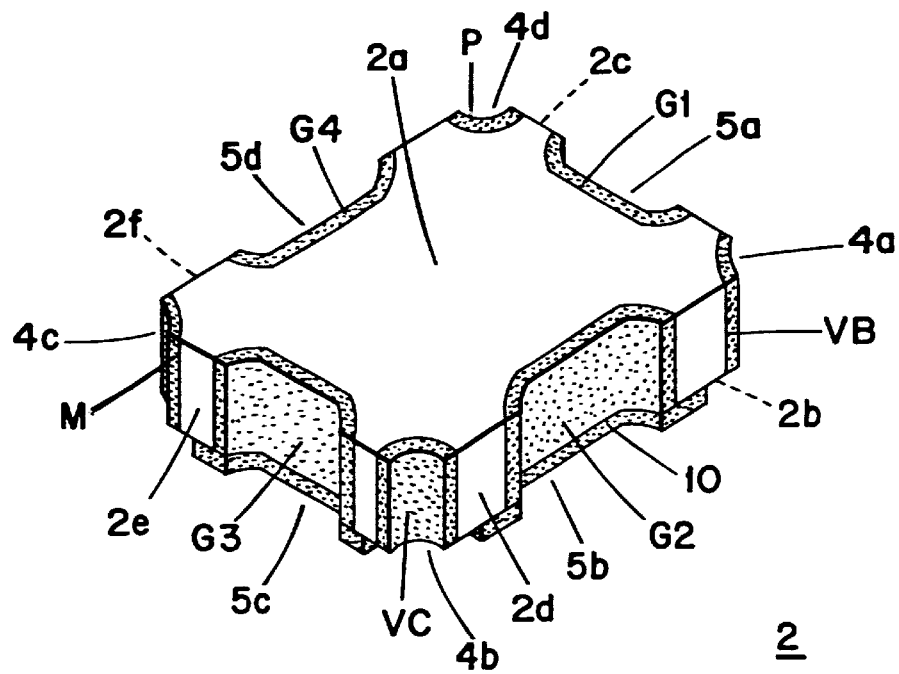
FIG. 3 is a perspective view of the substrate shown in FIG. 2.

As shown in FIG. 3, on almost the whole surface of the other main surface 2b of the substrate 2, a ground electrode 10 is provided. This ground electrode 10 is connected to the ground terminals G1 to G4 and is insulated from the input and output terminals VB, VC, M, and P. In FIG. 3, the circuit devices and the wiring section on the main surface 2a of the substrate 2 are omitted to simplify the figure.

The metal case 6 includes a bottom plate 7, side plates 8 continuous with the bottom plate 7, and a plurality of pegs 9 continuous with the side plates 8. The pegs are positioned next to, and then soldered to, the ground terminals G1 to G4 (indentations 5a to 5d of the substrate 2) to mount the metal case 6 on the substrate 2. Since the ground terminals G1 to G4 are formed at the indentations 5a to 5d which have a relatively large opening, they have a large contact area to form a contact with the pegs of the metal case 6. Accordingly, the task of mounting the metal case 6 onto the substrate is facilitated.

At the corners of the side plates 8 of the metal case 6, which correspond to the positions of the input and output terminals VB, VC, M and P of the substrate 2, notches 6a are formed to ensure insulation between the metal case 6 and each input or output terminal. By mounting the metal case 6 on the substrate 2 in this way, the voltage-controlled oscillator 1 is enclosed by the metal case 6 and the ground electrode 10 through the ground terminals G1 to G4. Therefore, since the metal case 6 and each circuit device connected to the wiring section have the same voltage in the voltage-controlled oscillator 1, external noise is blocked and the S/N characteristics are prevented from deteriorating.

Since the input and output terminals are provided at the corners of the substrate 2 in the voltage-controlled oscillator 1, the output terminal P and the power voltage terminal VB, which is an input terminal, are disposed with a distance generally equal to the length of the short side of the substrate 2. The output terminal P and the voltage control terminal VC, which is an input terminal, are disposed with a distance generally equal to the length of the diagonal of the substrate 2. Since the input and output terminals are disposed in this way with certain distances between them, high-frequency interference between these terminals are prevented from occurring. Thereby, the phase-noise (C/N) characteristic of the voltage-controlled oscillator 1 is prevented from deteriorating.

A manufacturing method for the voltage-controlled oscillator 1 will be described next.

Figure 4:
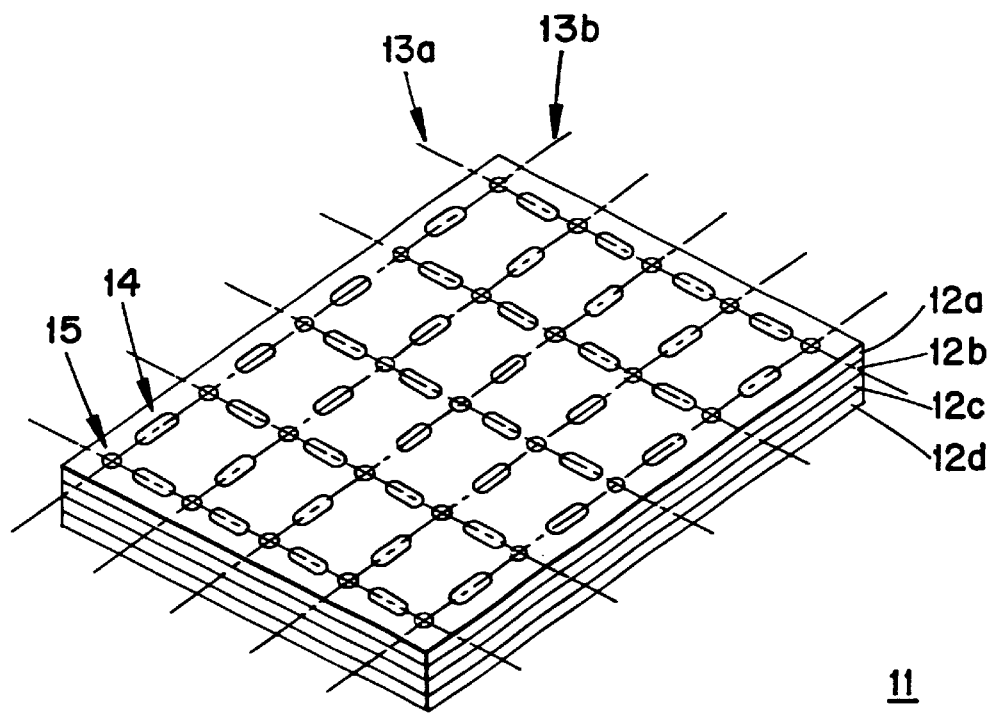
FIG. 4 is a perspective view of a motherboard for the substrate of the voltage-controlled oscillator shown in FIG. 1.
Figure 5:
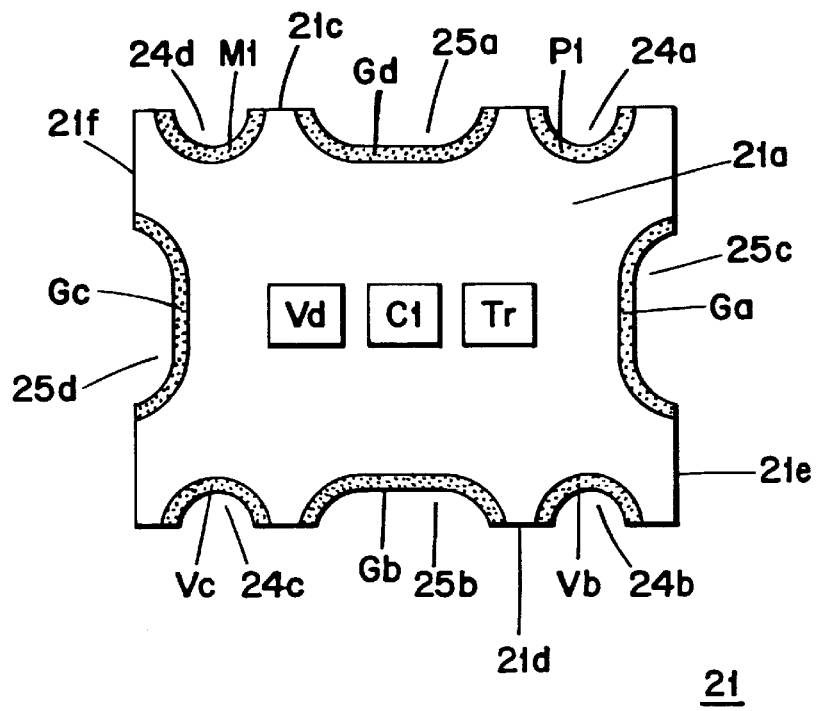
FIG. 5 is a top view of a substrate of a conventional voltage-controlled oscillator.
Figure 6:
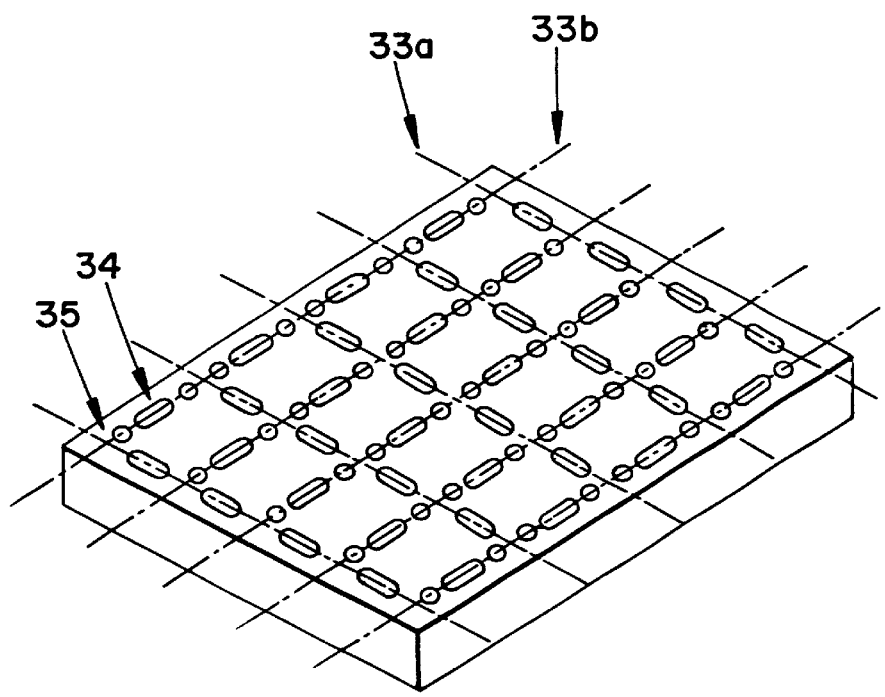
FIG. 6 is a perspective view of a motherboard for the substrate of the conventional voltage-controlled oscillator.

A motherboard 11 shown in FIG. 4 is prepared first. The motherboard 11 is formed by laminating ceramic sheets 12a, 12b, 12c, and 12d, and includes circuit devices and wiring sections (both not shown for simplicity) in the inside and on the surface for each substrate 2. The motherboard is partitioned by boundaries 13a and 13b. Further, the motherboard 11 is provided with through holes 14 having generally elongated-circular openings on the boundaries 13a and 13b, and with through holes 15 having generally circular openings at the intersections of the boundaries 13a and 13b. Those skilled in the art will appreciate that other shapes can be used to form the through holes. A conductive member (not shown) such as Ag is applied to the inner surfaces of the through holes 14 and 15 by electroless plating, or other technique. The inner surfaces are connected to the wiring sections provided for each substrate 2 at its inside and on the surface. Then, the motherboard 11 is cut along the boundaries 13a and 13b with a dicing saw to produce a plurality of the substrates 2. The through holes 14 and 15 are divided and the conductive member applied to the inner surfaces of the through holes 14 and 15 is thereby exposed to form the input terminals VB, VC, and M and the output terminal P at the respective corners of the substrate 2, and the ground terminals G1 to G4 at the respective side faces of the substrate 2, as shown in FIG. 2. The pegs 9 are soldered to the ground terminals G1 to G4 to mount the metal case 6 on the substrate 2, thereby completing the voltage-controlled oscillator 1. The pegs 9 of the metal case 6 are fit into the indentations 5a to 5d of the substrate 2 so that the side plates 8 and the pegs 9 form one surface continuous with the faces 2c to 2f of the substrate 2. This helps reduce the required extension of the outside dimensions of the voltage-controlled oscillator 1.

Since the through holes 15 are formed at the intersections of the boundaries 13a and the boundaries 13b, and are shared by four divisions (substrates 2) as input terminals or output terminals, the number of the through holes 15 is relatively small for the entire motherboard 11. This facilitates the task of making the through holes by reducing the number of through holes required. Also, since the total amount of the conductive material applied to the inner surfaces of the through holes 15 in order to form the input terminals VB, VC, and M and the output terminal P is relatively small, cost is reduced.

In the foregoing embodiment, a plurality of ceramic sheets are laminated to form the substrates. However, a plurality of sheets made from a material other than ceramic, such as glass epoxy and Teflon, for example, may be laminated to form the substrates. The substrates may also be formed from a single-plate member, and need not be a laminated structure.

Circuit devices used in a voltage-controlled oscillator according to the present invention are not limited to those shown in a simplified manner in the foregoing embodiment. Furthermore, the substrate 2 having the terminal configuration discussed above can be used for other types of electrical circuits besides voltage-controlled oscillators.

The shapes of the through holes provided for the motherboard or those of the terminals provided for the substrate are not limited to those shown in the above embodiment. Each terminal may be formed, for example, using an indentation having two right angles made by dividing a through hole having a rectangular opening formed in a motherboard.

In the above embodiment, a conductive member is applied to the inner surfaces of the through holes provided for the motherboard and the through holes are divided to form the terminals of each substrate. Further, the terminals may be formed by filling the through holes with a conductive member and by dividing the through holes.

In the above embodiment, the motherboard is divided into the substrates and then the metal case is mounted to each substrate. Alternatively, a plurality of the substrates may be formed by mounting a metal case on each substrate division on the motherboard which has not yet been cut, and then cutting the substrate.

In the above embodiment, the modulation terminal is provided as one input terminal and oscillation is started and stopped through this modulation terminal. An input terminal other than that having such a function may be provided. A terminal corresponding to the modulation terminal may be a so-called dummy terminal, which is substantially not provided with a terminal function.

Although the invention has been disclosed and illustrated with reference to a particular embodiment, the principles involved can be used in numerous other embodiments which will be apparent to persons skilled in the art. The invention is, therefore, to be limited only as indicated by the scope of the appended claims.

What is claimed is:

1. An electrical circuit comprising:

a substrate having side faces which are joined at corners;

a plurality of indentations formed in said side faces;

a circuit device and a wiring section provided on a first main surface of said substrate;

a ground electrode formed on another main surface of said substrate;

terminals formed by applying a conductive member to said plurality of indentations; and a metal case provided on the first main surface of said substrate to cover the first main surface, wherein at least one of said plurality of indentations is a corner indentation which is disposed at a corner of said substrate; and wherein a terminal formed at said at least one indentation disposed at the corner of said substrate serves as one of: an input terminal and an output terminal.

2. The electrical circuit according to claim 1, wherein said substrate includes multiple corners, each having a corner indentation and terminal disposed thereat.

3. The electrical circuit according to claim 2, further including additional side face indentations which are not disposed at any corner, each of said additional side face indentations having a respective terminal disposed thereat.

4. The electrical circuit according to claim 3, wherein said corner indentations are smaller than said side face indentations.

5. The electrical circuit according to claim 3, wherein said metal case includes pegs which extend into said respective side face indentations.

6. The electrical circuit according to claim 3, wherein said metal case includes notches formed over corners of said substrate.

7. The electrical circuit according to claim 3, wherein the circuit device and wiring section form a voltage controlled oscillator.

8. The electrical circuit according to claim 7, wherein said voltage controlled oscillator includes at least:

a varicap diode serving as a variable-capacitance device;

a capacitor;

at least one bypass capacitor; and at least one transistor.

9. The electrical circuit according to claim 7, wherein said substrate includes at least four terminals disposed at four respective corner indentations, wherein said four terminals comprise:

a modulation input terminal;

an output terminal;

a first input terminal; and a second input terminal.

10. The electrical circuit according to claim 9, wherein said modulation input terminal is diagonally disposed from said first input terminal, and said output terminal is diagonally disposed from said second input terminal.

11. The electrical circuit according to claim 7, wherein terminals which are formed at said side face indentations serve as ground terminals.

12. The electrical circuit according to claim 1, wherein said substrate is formed from a ceramic material.

13. The electrical circuit according to claim 1, wherein said substrate is comprised of plural laminated sheets.

14. A manufacturing method for an electrical device comprising the steps of:

providing, on a surface of a motherboard to be divided into a plurality of substrates by cutting, a circuit device and a wiring section for each respective substrate;

making through holes on boundaries which partition the motherboard into the substrates and at the intersections of the boundaries, and applying a conductive member to the through holes;

cutting the motherboard along the boundaries to thereby form an indentation and a terminal at each corner and at each side face of the plurality of the substrates; and mounting a metal case for covering a main surface of each respective substrate.

15. The method according to claim 14, wherein said step of making through holes comprises forming through holes having at least two different sizes.

16. The method according to claim 15, wherein through holes located on the intersections of the boundaries have a first size, and through holes located elsewhere on the boundaries have a second size, wherein the first size is smaller than the second size.

17. The method of claim 16, wherein the through holes of the first size have a generally circular shape, while the through holes of the second size have a generally elongated circular shape.

18. The method of claim 14, further comprising a preliminary step of forming the motherboard by laminating plural sheets of material together.

19. The method of claim 14, wherein said metal case includes pegs, and the method further includes the step of soldering the pegs to respective ground terminals formed on the substrate.

20. The method of claim 14, wherein said electrical device is a voltage-controlled oscillator.

* * * * *